(12) United States Patent
Sabnis

(10) Patent No.: US 6,852,474 B2
(45) Date of Patent: Feb. 8, 2005

(54) POLYMERIC ANTIREFLECTIVE COATINGS DEPOSITED BY PLASMA ENHANCED CHEMICAL VAPOR DEPOSITION

(75) Inventor: Ram W. Sabnis, Evansville, IN (US)

(73) Assignee: Brewer Science Inc., Rolla, MO (US)

(*) Notice: Subject to any disclaimer, the term of this patent is extended or adjusted under 35 U.S.C. 154(b) by 103 days.

(21) Appl. No.: 10/423,618

(22) Filed: Apr. 24, 2003

(65) Prior Publication Data

US 2003/0224586 A1 Dec. 4, 2003

Related U.S. Application Data

(60) Provisional application No. 60/376,634, filed on Apr. 30, 2002.

(51) Int. Cl.[7] .............................. G03C 5/00; H05K 3/00; H01L 21/31
(52) U.S. Cl. ....................... 430/317; 430/313; 438/780; 427/96.1
(58) Field of Search .............................. 430/271.1, 313, 430/317; 438/780; 427/96.1

(56) References Cited

U.S. PATENT DOCUMENTS 4,137,365 A * 1/1979 Fletcher et al. ............. 428/412
6,207,238 B1 * 3/2001 Affinito ...................... 427/488

FOREIGN PATENT DOCUMENTS

JP 408062401 * 3/1996

OTHER PUBLICATIONS

Computer translation of JP–408062401, Mar. 1996.*

* cited by examiner

Primary Examiner—Rosemary Ashton
(74) Attorney, Agent, or Firm—Hovey Williams LLP (57) ABSTRACT

An improved method for applying polymeric antireflective coatings to substrate surfaces and the resulting precursor structures are provided. Broadly, the methods comprise plasma enhanced chemical vapor depositing (PECVD) a polymer on the substrate surfaces. The PECVD processes comprise providing a quantity of a polymer generated by introducing monomer vapors into a plasma state followed by polymerization thereof, with assistance of plasma energy, onto the surface of a substrate. The most preferred starting monomers are phenylacetylene, 4-ethynyltoluene, and 1-ethynyl-2-fluorobenzene. The inventive methods are useful for providing highly conformal antireflective coatings on large surface substrates having super submicron (0.25 µm or smaller) features. The process provides a much faster deposition rate than conventional chemical vapor deposition (CVD) methods, is environmentally friendly, and is economical.

34 Claims, 6 Drawing Sheets

POLYMERIC ANTIREFLECTIVE COATINGS DEPOSITED BY PLASMA ENHANCED CHEMICAL VAPOR DEPOSITION

RELATED APPLICATIONS

This application claims the priority benefit of a provisional application entitled POLYMERIC ANTIREFLECTIVE COATINGS DEPOSITED BY PLASMA ENHANCED CHEMICAL VAPOR DEPOSITION, Ser. No. 60/376,634, filed Apr. 30, 2002, incorporated by reference herein.

BACKGROUND OF THE INVENTION

1. Field of Invention

The present invention is broadly concerned with methods of forming antireflective coating layers on silicon and dielectric materials as well as the resulting integrated circuit precursor structures. More particularly, the inventive methods comprise providing a quantity of a polymer generated by the introduction of monomers into a plasma state by electric current and subsequent polymerization thereof, with the aid of plasma energy, onto the surface of a substrate.

2. Background of the Prior Art

Integrated circuit manufacturers are consistently seeking to maximize silicon wafer sizes and minimize device feature dimensions in order to improve yield, reduce unit case, and increase on-chip computing power. Device feature sizes on silicon chips are now submicron in size with the advent of advanced deep ultraviolet (DUV) microlithographic processes. However, reducing the substrate reflectivity to less than 1% during photoresist exposure is critical for maintaining dimension control of such submicron features. Therefore, light absorbing polymers known as antireflective coatings are applied beneath photoresist layers in order to reduce the reflectivity normally encountered from the semiconductor substrates during the photoresist DUV exposure.

These antireflective layers are typically applied to the semiconductor substrates by a process called spincoating. While spincoated antireflective layers offer excellent reflectivity control, their performance is limited by their nonuniformity, defectivity and conformality constrictions, and other inefficiencies inherent within the spincoating process. As the industry approaches the adoption of eight-inch or even twelve-inch semiconductor substrates, the inherent inefficiencies of the spincoating process become magnified.

When spincoated at thicknesses ranging from 500 Å to 2500 Å, commercial organic antireflective coating layers require polymers specifically designed to prevent molecular intermixing with adjacent photoresist layers coated and baked thereon. Although high optical densities at DUV wavelengths enable these pre-designed polymers to provide effective reflectivity control at prior art dimensions, they have numerous drawbacks.

One problem with the currently available antireflective coating application processes is inadequate planarization. Organic antireflective coatings are usually formed by spin-coating. The formed layers typically lack uniformity in that the thickness at the edge of the substrate is greater than the thickness at the center. Furthermore, spincoated antireflective coating layers tend to planarize or unevenly coat surface topography rather than form highly conformal layers (i.e., layers which evenly coat each aspect of the substrate and the features). For example, if an antireflective coating layer with a nominal layer thickness of 1000 Å is spincoated over raised features having feature heights of 0.25 $\mu$m, the layer may prove to be only 350 Å thick on top of the features, while being as thick as 1800 Å in the troughs located between the raised features. When planarization occurs with these ultramicroscopic feature sizes, the antireflective coating layer is too thin on the top of the features to provide the desired reflection control at the features. At the same time, the layer is too thick in the troughs to permit efficient layer removal during subsequent plasma etch. That is, in the process of clearing the antireflective coating from the troughs by plasma etch, the sidewalls of the resist features become eroded, producing microscopically-sized—but significant—changes in the feature shape and/or dimensions. Furthermore, the resist thickness and edge acuity may be lost, which can lead to inconsistent images or feature patterns as the resist pattern is transferred into the substrate during subsequent etching procedures.

Other problems can occur as well due to the fact that spincoating of these ultra-thin antireflective coating layers takes place at very high speeds in a dynamic environment. Accordingly, pinholes, voids, striations, bubbles, localized poor adhesion, center-to-edge thickness variations, and other defects occur as a consequence of attendant rapid or nonuniform solvent evaporation, dynamic surface tension, and liquid-wavefront interaction with the surface topography. The defects stemming therefrom become unacceptable with increased wafer size (e.g., eight- to twelve-inch wafers) and when patterning super submicron (e.g., 0.25 $\mu$m or smaller) features.

There is a need for an improved process of depositing antireflective coatings, and particularly organic antireflective coatings, on various substrates. This process should overcome the above-mentioned drawbacks while providing for rapid deposition of the antireflective coatings.

SUMMARY OF THE INVENTION

The present invention overcomes these problems by broadly providing improved methods of applying antireflective coatings to silicon wafers, dielectric materials, and other substrates (e.g., silicon, aluminum, tungsten, tungsten silicide, gallium arsenide, germanium, tantalum, tantalum nitride, mixed metal salts, SiGe, and other reflective surfaces) utilized in microelectronics (semiconductor and circuit manufacturing processes), optoelectronics (display devices), photonics (optical waveguides), and microelectromechanical systems (MEMS).

In more detail, the inventive methods preferably comprise converting a quantity of an antireflective compound (which can be in the solid, liquid, or gas state) into a plasma state by applying an electric current to the compound under pressure. This is preferably accomplished by increasing the pressure of the system to a level of from about 10–200 mTorr, more preferably from about 25–150 mTorr, and even more preferably from about 25–100 mTorr. As the pressure is increased, an electric current of from about 0.1–10 amps, preferably from about 0.5–8 amps, and more preferably from about 1–1.5 amps is then applied to the compound. For compounds having a boiling or melting point of greater than about 100° C., slight heating may be necessary as the current is applied.

The deposition of the layer on the substrate is very rapid, much more rapid than conventional chemical vapor deposition (CVD) processes. More particularly, the layers are formed at a rate of at least about 100 Å/min., preferably at least about 130 Å/min., and more preferably from about 135–700 Å/min. on an eight-inch round substrate. It will be appreciated that this provides a significant advantage to the circuit manufacturing process.

The antireflective compound comprises one or more types of monomers which can be selected depending upon the intended application conditions. After the monomers are formed into a plasma, the monomers will polymerize and deposit in a layer on the substrate. A layer of photoresist can then be applied to the resulting antireflective layer to form a precursor structure which can be subjected to the remaining steps of the circuit manufacturing process (i.e., applying a mask to the photoresist layer, exposing the photoresist layer to radiation at the desired wavelength, developing and etching the photoresist layer).

In one embodiment, preferred monomers comprise a light attenuating moiety and an unsaturated moiety (i.e., a group comprising at least one double bond and/or at least one triple bond), the latter of which readily reacts during the plasma enhanced chemical vapor deposition (PECVD) process to bond with other monomers as the layer polymerizes on the substrate. Preferred unsaturated moieties include alkenyl groups (preferably $C_2$–$C_{20}$) and alkynyl groups (preferably $C_2$–$C_8$).

In another embodiment, the monomers have the formula wherein:
each R is individually selected from the group consisting of alkynyl groups (preferably $C_2$–$C_{20}$, more preferably $C_2$–$C_{10}$, and even more preferably $C_2$–$C_8$) and alkenyl groups (preferably $C_2$–$C_{20}$, more preferably $C_2$–$C_{10}$, and even more preferably $C_2$–$C_6$) other than —CH=$CH_2$ and —$CH_2$—CH=$CH_2$;
each X is individually selected from the group consisting of alkyl groups (preferably $C_1$–$C_{20}$, preferably $C_1$–$C_{10}$, and more preferably $C_1$–$C_6$), cyano groups, nitroso groups, and the halogens;
m is 0–10, and preferably about 1–5; and
n is about 1–12, and preferably about 1–5.

Preferred alkyl groups include methyl, ethyl, n-propyl, iso-propyl, n-butyl, iso-butyl, pentyl, hexyl, heptyl, octyl, nonyl, decyl, dodecyl, and amyl groups. It is preferred that the ringed structure be a light attenuating moiety or group. Preferred light attenuating moieties comprise a cyclic compound such as benzene, naphthalene, anthracene, acridine, furan, thiophene, pyrrole, pyridine, pyridazine, pyrimidine, pyrazine, thiazine, oxazine, thiazole, oxazole, pyrazole, oxadiazole, quinazoline, and quinoxaline moieties.

Even more preferably the monomer has the formula wherein:
each R is individually selected from the group consisting of alkynyl groups;
each X is individually selected from the group consisting of alkyl groups, cyano groups, nitroso groups, and the halogens;
m is 0–5;
n is 1–6; and
the sum of m and n is less than or equal to 6.

The monomers should have a melting or boiling point of less than about 450° C., preferably less than about 200° C., more preferably less than about 150° C., and even more preferably from about 10–100° C. Melting or boiling points of less than about 100° C. result in an improved deposition rate.

Preferred monomers for use in the inventive processes are those selected from the group consisting of phenylacetylene, 2-ethynyltoluene, 3-ethynyltoluene, 4-ethynyltoluene, 1-ethynyl-2-fluorobenzene, 1-ethynyl-3-fluorobenzene 1-ethynyl-4-fluorobenzene, ethynyl-p-toluene sulfonate, 1-phenyl-2-propyn-1-ol, 4-(trimethylsilylethynyl) benzaldehyde, 1-bromo-2-ethynylbenzene, 1-bromo-4-ethynylbenzene, 1-chloro-2-ethynylbenzene 1-chloro-4-ethynylbenzene, 1-chloro-4-(phenylethynyl)benzene, 1-ethynyl-4-pentylbenzene, 1-ethynyl-4-nitrobenzene, 1-ethynyl-3-methoxybenzene 1-ethynyl-4-methoxybenzene, 1-ethynyl-4-pentylbenzene, 1-(dimethylsilyl)-2-phenylacetylene, 4-bromo-1-ethynyl-2-fluorobenzene, 4-ethynyl-biphenyl, 1-ethynyl-4-methylbenzene, 1-phenyl-1-hexyne, diphenylacetylene, 1-propargyl-1H-benzotriazole, propargyl p-toluenesulfonate, 1-phenyl-2-propyn-1-ol, phenylpropargyl ether, phenylpropargyl aldehyde, phenylpropargyl aldehyde diethyl acetal, 3-ethynylaniline, 4-ethynylaniline, 2-ethynylpyridine, 3-ethynylpyridine, 1-ethynylnaphthalene, 1-ethynyl-1-cyclohexanol, 1-ethynylcyclohexene, 1-ethynylcyclopentanol, 1-ethynylcyclohexylamine, 1-ethynyl-2,4-difluorobenzene, ethynylmagnesium bromide, and ethynylmagnesium chloride.

The resulting precursor structures have antireflective coating layers which are surprisingly defect-free. Thus, there are less than about 0.1 defects/$cm^2$ of antireflective layer (i.e., less than about 15 defects per 8-inch wafer), and preferably less than about 0.05 defects/$cm^2$ (i.e., less than about 7.5 defects per 8-inch wafer), when observed under an optical microscope. Furthermore, these essentially defect-free films can be achieved on 6–12 inch substrates having super submicron features (less than about 0.25 µm in height). As used herein, the term "defects" is intended to include pinholes, dewetting problems where the film doesn't coat the surface, and so-called "comets" in the coating where a foreign particle contacts the substrate surface causing the coating to flow around the particle.

The antireflective layers prepared according to the invention can be formulated to have a thickness of anywhere from about 100–5000 Å, and preferably 300–5000 Å, and can also be tailored to absorb light at the wavelength of interest, including light at a wavelength of from about 150–500 nm (e.g., 365 nm or i-line wavelengths, 435 nm or g-line wavelengths, 248 nm deep ultraviolet wavelengths, and 193 nm wavelengths), and preferably from about 190–300 nm. Thus, the antireflective layers will absorb at least about 90%, and preferably at least about 95%, of light at wavelengths of from about 150–500 nm. Furthermore, the antireflective layers have a k value (the imaginary component of the complex index of refraction) of at least about 0.1, preferably at least about 0.35, and more preferably at least about 0.4, and an n value (the real component of the complex index of refraction) of at least about 1.1, preferably at least about 1.5, and more preferably at least about 1.6 at the wavelength of interest (e.g., 193 nm).

The deposited antireflective layer is also substantially insoluble in solvents (e.g., ethyl lactate, propylene glycol monomethyl ether acetate) typically utilized in a photoresist layer which is subsequently applied to the antireflective layer. That is, the thickness of the layer will change by less than about 10%, preferably less than about 5%, and more preferably less than about 1% after contact with the photoresist solvent. As used herein, the percent change is defined as:

$$100 \cdot \frac{|(\text{thickness prior to solvent contact}) - (\text{thickness after solvent contact})|}{(\text{thickness prior to solvent contact})}$$

The antireflective layers deposited on substrate surfaces according to the invention are also highly conformal, even on topographic surfaces (as used herein, surfaces having raised features of 1000 Å or greater and/or having contact or via holes formed therein and having hole depths of from about 1000–15,000 Å). Thus, the deposited layers have a percent conformality of at least about 85%, preferably at least about 95%, and more preferably about 100%, wherein the percent conformality is defined as:

$$100 \cdot \frac{|(\text{thickness of the film at location } A) - (\text{thickness of the film at location } B)|}{(\text{thickness of the film at location } A)},$$

wherein: "A" is the centerpoint of the top surface of a target feature when the target feature is a raised feature, or the centerpoint of the bottom surface of the target feature when the target feature is a contact or via hole; and "B" is the halfway point between the edge of the target feature and the edge of the feature nearest the target feature. When used with the definition of percent conformality, "feature" and "target feature" is intended to refer to raised features as well as contact or via holes. As also used in this definition, the "edge" of the target feature is intended to refer to the base of the sidewall forming the target feature when the target feature is a raised feature, or the upper edge of a contact or via hole when the target feature is a recessed feature.

Finally, in addition to the aforementioned antireflective layer properties, the instant invention has a further distinct advantage over prior art spincoating methods which utilize large quantities of solvents. That is, the instant methods avoid spincoating solvents which often require special handling. Thus, solvent waste is minimized and so are the negative effects that solvent waste can have on the environment. Furthermore, overall waste is minimized with the inventive process wherein substantially all of the reactants are consumed in the process.

DETAILED DESCRIPTION OF THE PREFERRED EMBODIMENTS

Examples

The following examples set forth preferred methods in accordance with the invention. It is to be understood, however, that these examples are provided by way of illustration and nothing therein should be taken as a limitation upon the overall scope of the invention.

Materials and Methods

Examples 1–3

The PECVD process to which the antireflective compounds were subjected in the following Examples 1–3 involved subjecting the compounds to sufficient electric current and pressure so as to cause the solid or liquid compounds to form a plasma. The monomers to be deposited were initially weighed in a glass vial (generally around 0.2 g although the amount consumed is not known). The vial containing the monomers was attached (via a rubber stopper) to a quartz chamber connected to a stainless steel pipe, with flow through the steel pipe being controlled by a needle valve. The quartz chamber was surrounded by an RF coil which, in turn, was connected to an RF generator. The RF generator generated the electric current in the quartz chamber through the RF coil. The quartz chamber was also connected to a deposition chamber in which the substrates were loaded.

The pressure of the system was increased to a level of from about 10–200 mTorr, more preferably from about 25–150 mTorr, and even more preferably from 25–100 mTorr. The RF plasma power was preferably set at around 5–300 watts, more preferably about 15–150 watts, and even more preferably about 20–80 watts, and the mode was pulsed (i.e., on/off mode) at a duty cycle of about 5–95%, and preferably about 30%. The system can be under gas (e.g., an inert gas such as argon gas). The monomer flow rate (and gas flow rate, if applicable) was kept at 5–50 sccm, more preferably at 8–40 sccm, and even more preferably at 9–30 sccm. The monomers were vaporized into a plasma state in a quartz chamber, and then polymerized and deposited on the substrate in the deposition chamber. The substrates included six- or eight-inch flat wafers, topography wafers, quartz slides, aluminum substrates, tantalum (Ta) substrates, tantalum nitride (TaN) substrates, and dense patterned (1:1), semidense patterned (1:2), isolated patterned (1:4), and blank resist patterned 0.25 μm-sized via holes. The substrates were rotated at about 2–10 rpm, more preferably at about 4–8 rpm, and even more preferably at about 6 rpm in order to ensure uniform coating.

Example 1

Deposition of Phenylacetylene by PECVD

Structure A

Organic, polymeric thin films were prepared by polymerizing 0.2 g of phenylacetylene (Structure A, obtained from Sigma-Aldrich Company) onto six- or eight-inch flat silicon wafers, 7000 Å (1:1) topography wafers, dense (1:1), semidense (1:2), and isolated (1:4) blank resist patterned 0.25 μm sized via holes quartz slides, aluminum substrates, tantalum substrates, and tantalum nitride substrates by a PECVD process. An initial eight runs on flat substrates were conducted to determine the best film thicknesses, optical properties, film uniformities, intermixing with photoresist, resistance to resist solvents, and adhesion to various substrates. The topography wafers were used to determine conformal properties. During deposition, the pressure was maintained at around 25 mTorr, and the temperature of the monomer was about 35° C. The RF plasma power was set at 45 watts with pulsing at 60/20 (on/off) msec. The monomer flow rate was maintained at 20 sccm. The substrate was rotated at 6 rpm in order to ensure a uniform coat. The phenylacetylene was deposited at a rate of 200 Å/min.

Example 2

Deposition of 4-Ethynyltoluene by PECVD

Structure B

Organic, polymeric thin films were prepared by polymerizing 0.2 g of 4-ethynyltoluene (Structure B, obtained from Sigma-Aldrich Company) onto six- or eight-inch flat silicon wafers, 7000 Å (1:1) topography wafers, dense (1:1), semidense (1:2), and isolated (1:4) blank resist patterned 0.25 μm sized via holes quartz slides, aluminum substrates, tantalum substrates, and tantalum nitride substrates by a PECVD process. During deposition, the pressure was maintained around 20 mTorr, and the temperature was room temperature (about 23° C.). The RF plasma power was set at 125 watts with pulsing at 90/50 (on/off) msec. The monomer flow rate was maintained at 25 sccm. The substrate was rotated at 6 rpm in order to ensure a uniform coat. The 4-ethynyltoluene was deposited at a rate of 150 Å/min.

Example 3

Deposition of 1-Ethynyl-2-Fluorobenzene by PECVD

Structure C

Organic, polymeric thin films were prepared by polymerizing 0.2 g of 1-ethynyl-2-fluorobenzene (Structure C, obtained from Sigma-Aldrich Company) onto six- or eight-inch flat silicon wafers, 7000 Å (1:1) topography wafers, dense (1:1), semidense (1:2), and isolated (1:4) blank resist patterned 0.25 μm sized via holes quartz slides, aluminum substrates, tantalum substrates, and tantalum nitride substrates by a PECVD process. During deposition, the pressure was maintained around 55 mTorr, and the temperature was room temperature (about 23° C.). The RF plasma power was set at 20 watts with pulsing at 100/50 (on/off) msec. The gas flow rate was maintained at 10 sccm using argon gas, and the monomer flow rate was maintained at 10 sccm. The substrate was rotated at 6 rpm in order to ensure a uniform coat. The 1-ethynyl-2-fluorobenzene was deposited at a rate of 188 Å/min.

Characteristics Properties

The deposition parameters according to Examples 1–3 are summarized in Table 1.

TABLE 1

| | Deposition Parameters | | | |
| Monomer | RF Power (watts) | Pressure (mTorr) | Monomer Flow Rate (sccm) | Argon Flow Rate (sccm) |
| --- | --- | --- | --- | --- |
| phenylacetylene | 45 | 25 | 20 | — |
| 4-ethynyltoluene | 125 | 20 | 25 | — |
| 1-ethynyl-2-fluorobenzene | 20 | 55 | 10 | 10 |

Example 1

The deposition rate of phenylacetylene according to Example 1 was 200 Å/min., which is within the desired deposition range in the semiconductor industry standard for batch processing tools.

The film of phenylacetylene was deposited on silicon wafers, and the film thickness was optically measured by ellipsometry at 25 points on a planar silicon wafer to estimate the mean thickness. The phenylacetylene generated uniform coats, without pinholes, voids, or particles, having a preferred thickness of 400 Å. The films exhibited a thickness uniformity of >96% on 4-inch and 8-inch silicon wafers.

The solubility of phenylacetylene was examined by treating the film with solvents typically used in the semiconductor industry. The solvents evaluated were ethyl lactate and propylene glycol monomethyl ether acetate (PGMEA). Very little thickness loss was observed (see Table 2).

TABLE 2

| | Stripping Test | | | |
| Sample | Solvent | Initial Thickness (Å) | Final Thickness (Å) | Stripping (%) |
| --- | --- | --- | --- | --- |
| phenylacetylene | PGMEA | 970 | 962 | 0.8 |
| phenylacetylene | Ethyl lactate | 448 | 445 | 0.7 |

Figure 1:
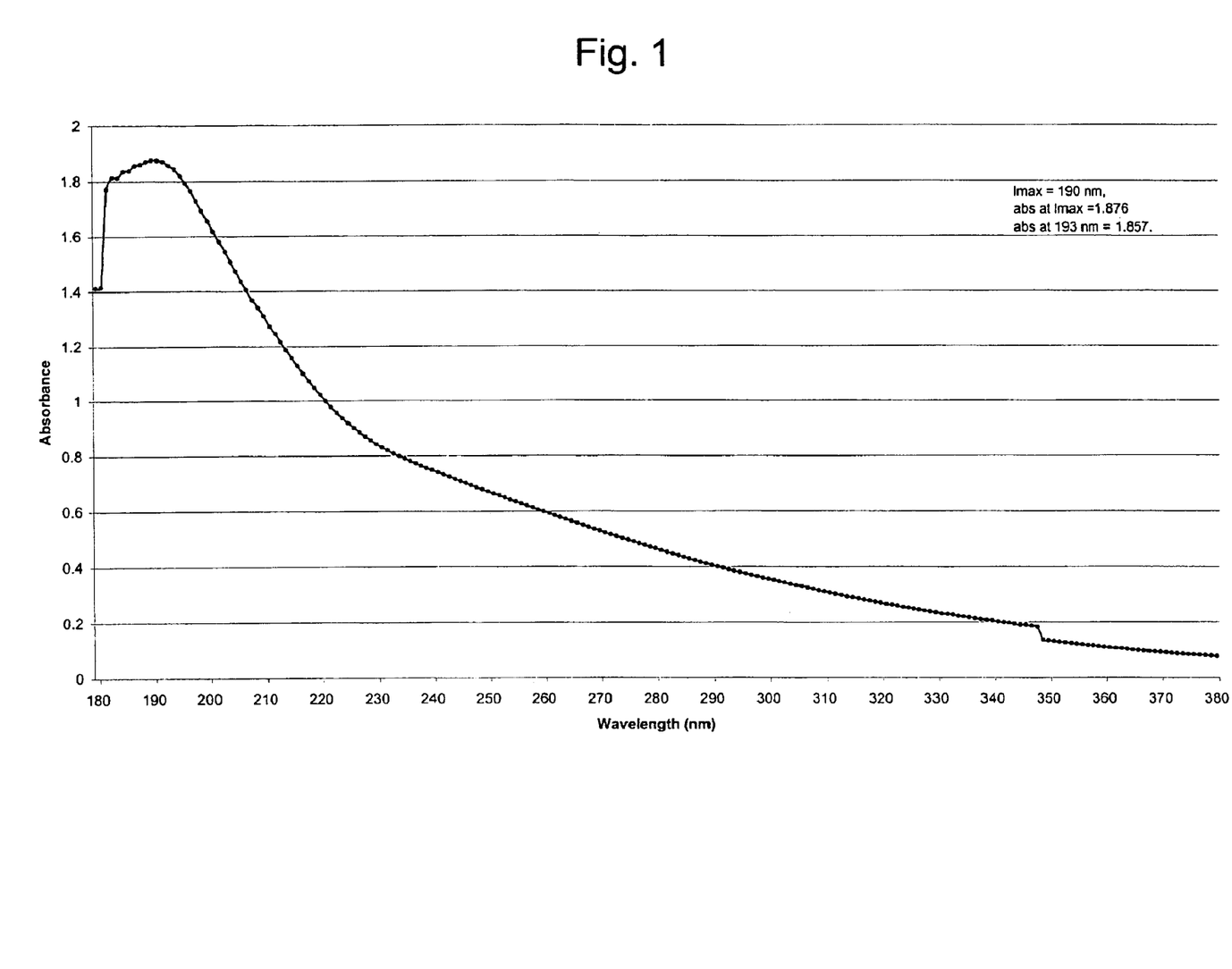
FIG. 1 is a graph depicting the ultraviolet-visible (UV-Vis) spectrum of a phenylacetylene film deposited on a quartz slide by the inventive PECVD process.

FIG. 1 is a graph showing the ultraviolet-visible (UV-Vis) spectrum of the film deposited on a quartz slide according to this example. The $\lambda_{max}$ was at 190 nm, thus demonstrating that phenylacetylene-based antireflective films are useful for 193 nm applications. The optical density of phenylacetylene was 18.76/μm at 193 nm.

Figure 2:
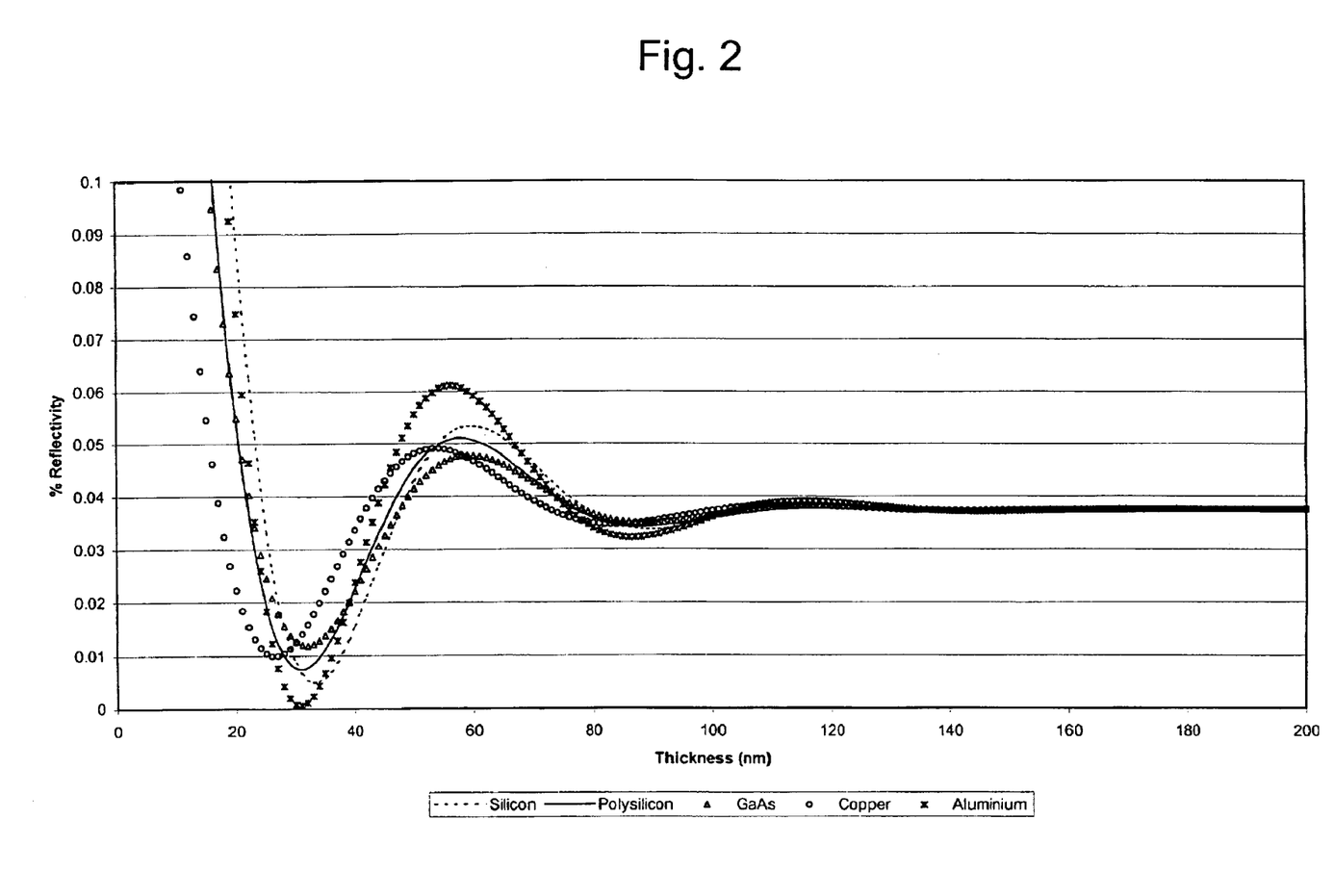
FIG. 2 is a graph showing the reflectance curve of a phenylacetylene film deposited on various substrates by the inventive PECVD process.

The optical constants were measured by VASE (variable angle spectroscopic ellipsometry) analysis. The average real portion of the refractive index (n) and the imaginary index (k) were determined. These values were n=1.649 and k=0.678 at 193 nm. The optical density of phenylacetylene was 18.76/μm at 193 nm. FIG. 2 is a graph showing the reflectance curve of this sample deposited on various substrates. The first minimum thickness was 310 Å, and the second minimum thickness was 870 Å. The first minimum thickness of phenylacetylene showed 0% reflectance at 310 Å on an aluminum substrate.

Figure 3A:
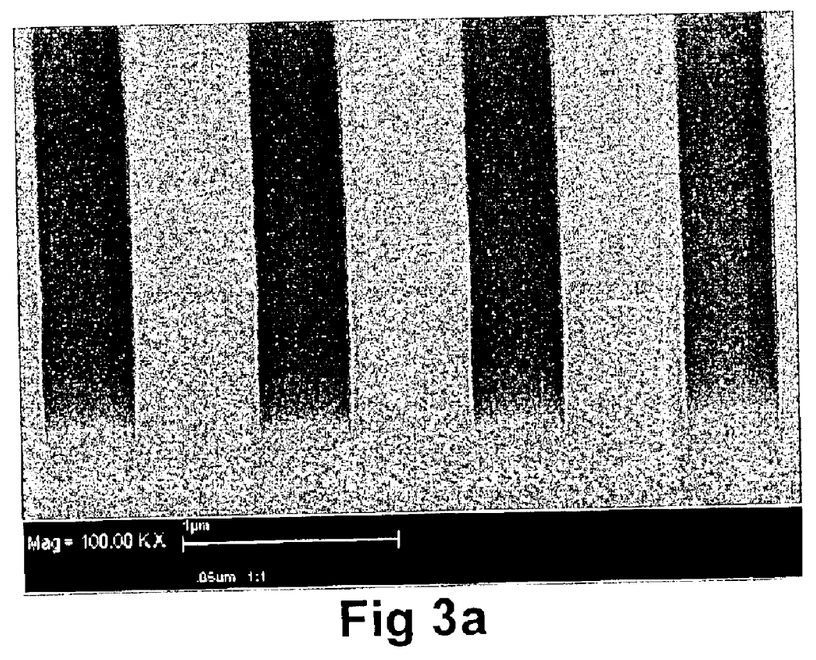
FIG. 3a is a scanning electron microscope (SEM) photograph showing the film conformality of a 400 Å thick, phenylacetylene film deposited on 7000 Å (1:1) topography wafers by the inventive PECVD process.
Figure 3B:
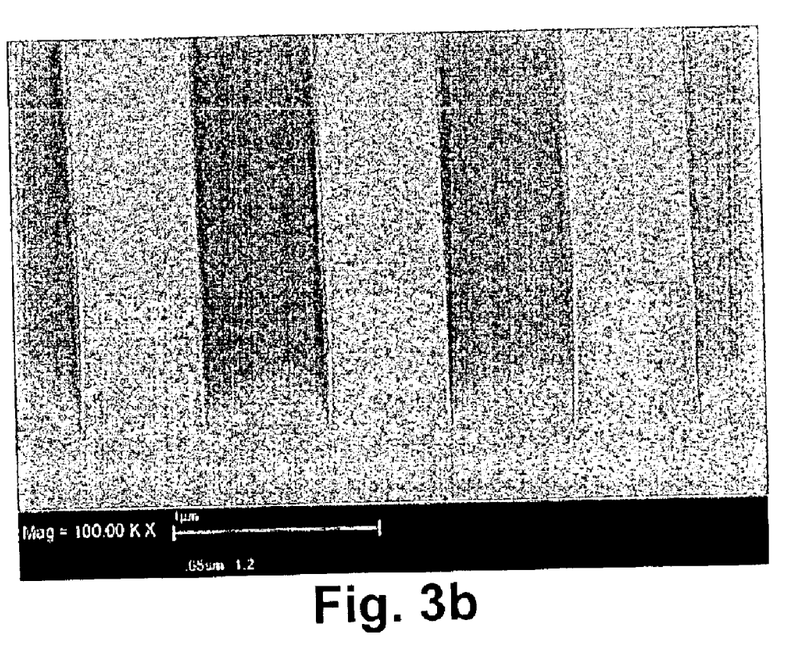
FIG. 3b is an SEM photograph showing the film conformality of a 400 Å thick, phenylacetylene film deposited on 7000 Å (1:2) topography wafers by the inventive PECVD process.
Figure 3C:
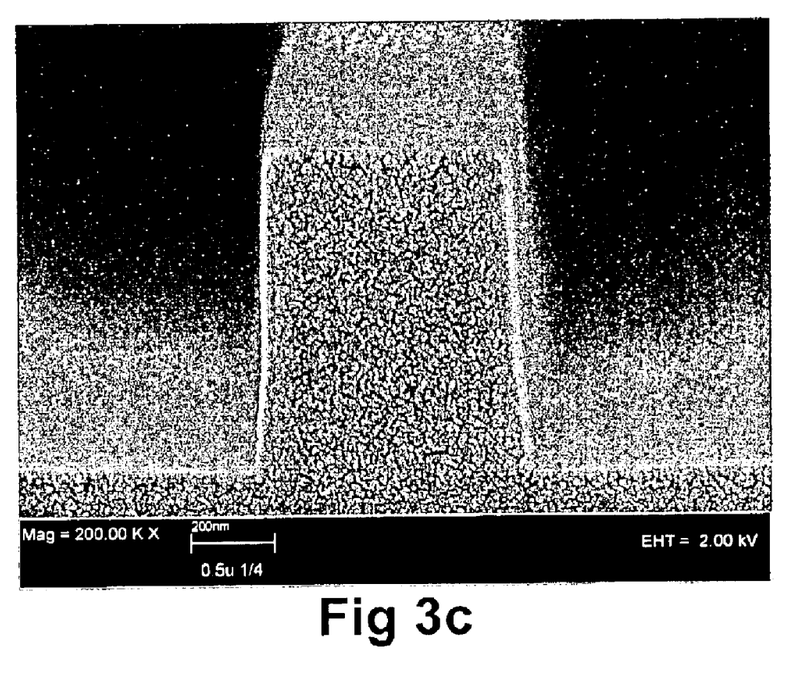
FIG. 3c is an SEM photograph showing the film conformality of a 400 Å thick, phenylacetylene film deposited on 7000 Å (1:4) topography wafers by the inventive PECVD process.

FIG. 3a is an SEM photograph showing the film conformality of a 400 Å thick film of phenylacetylene on 7000 Å (1:1) topography wafers deposited by the inventive PECVD process. FIG. 3b is an SEM photograph showing the film conformality of a 400 Å thick film of phenylacetylene on 7000 Å (1:2) topography wafers deposited by the inventive PECVD process. FIG. 3c is an SEM photograph showing the film conformality of a 400 Å thick film of phenylacetylene on 7000 Å (1:4) topography wafers deposited by the inventive PECVD process. These photographs demonstrate that PECVD-deposited phenylacetylene can provide a greater than 98% conformal film.

Adhesion of a phenylacetylene film prepared according to Example 1 was examined on various electronic substrates using the transparent tape peel test. PECVD-deposited, phenylacetylene films showed excellent adhesion on all the substrates.

The film of phenylacetylene on a silicon wafer was also examined under an optical microscope. No pinholes, striations, dewetting, comets, or particles were observed. The phenylacetylene-based films were extremely uniform without any visible defects.

Figure 4:
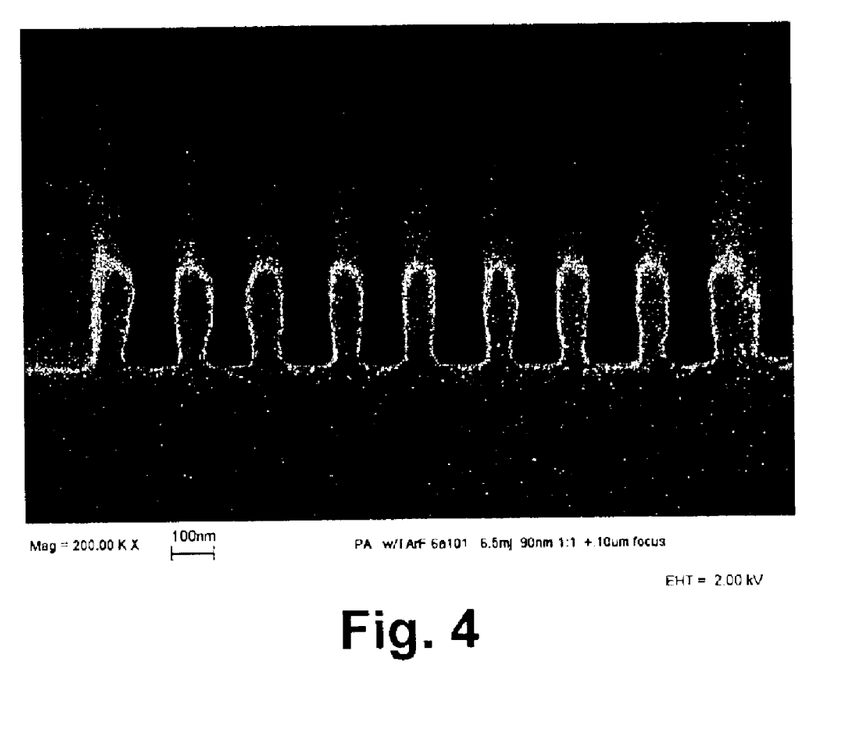
FIG. 4 is an SEM photograph showing the resist profile of a cross-section of a phenylacetylene film deposited by the inventive PECVD process and utilizing a commercially available photoresist.

Photolithography of the phenylacetylene on a silicon wafer, prepared according to Example 1 and having a film thickness of 400 Å, was performed using a TARF6a101 photoresist (from Tokyo Ohka Kogyo Co. Ltd., Japan), a JSRAR230J photoresist (from Japan Synthetic Rubber, Japan), and a GAR8105G photoresist (from Arch Chemicals inc., USA). The best results were achieved using the TARF6a101 photoresist. The wafers were cross-sectioned, and the resist features were examined with a scanning electron microscope. FIG. 4 is an SEM photograph showing the excellent resist profile of the phenylacetylene film using the TARF6a101 photoresist. Resist profiles as small as 60 nm dense lines were achieved.

Example 2

The deposition rate of 4-ethynyltoluene was 150 Å/min., which is within the desired deposition range in the semiconductor industry standard for batch processing tools.

A film of 4-ethynyltoluene was deposited on silicon wafers, and the thickness of the film was optically measured by ellipsometry at 25 points on a planar silicon wafer to estimate the mean thickness. The 4-ethynyltoluene generated a uniform coating, without pinholes, voids, or particles, and having a preferred thickness of 760 Å. The films had a thickness uniformity of >96% on 4-inch and 8-inch silicon wafers.

Figure 5:
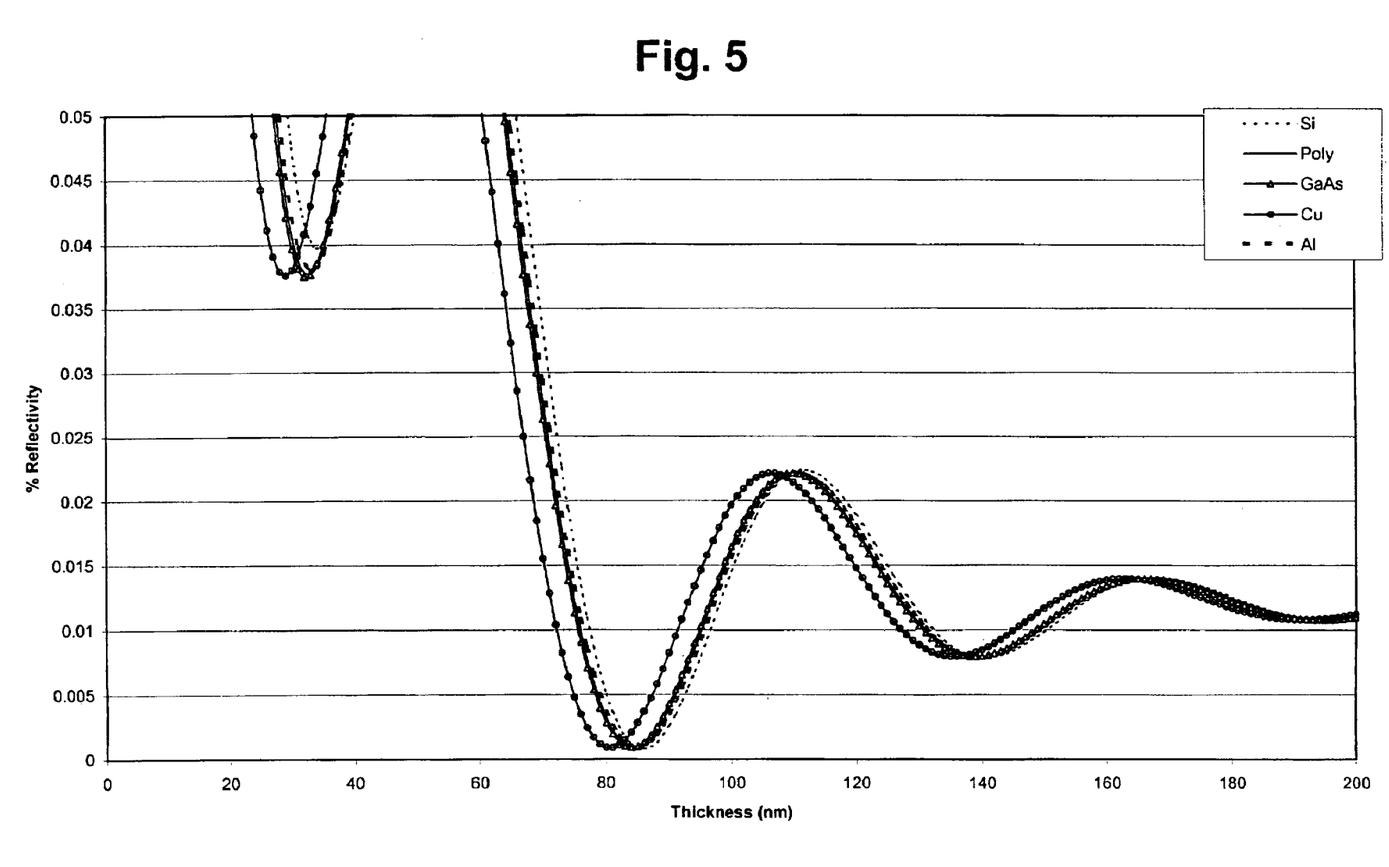
FIG. 5 is a graph showing the reflectance curve of 4-ethynyltoluene films deposited on various substrates by the inventive PECVD process.

The optical constants were measured by VASE analysis. The average real portion of the refractive index (n) and the imaginary index (k) were n=1.84 and k=0.65 at 193 nm. FIG. 5 is a graph showing the reflectance curve of a 4-ethynyltoluene film on various substrates. The first minimum thickness was 290 Å, and the second minimum thickness was 800 Å.

An 4-ethynyltolueneon film on a silicon wafer was examined under an optical microscope. No pinholes, striations, dewetting, comets, or particles were observed. The 4-ethynyltoluene-based films were extremely uniform without any visible defects.

Example 3

The deposition rate of 1-ethynyl-2-fluorobenzene was 188 Å/min, which is within the desired deposition range in the semiconductor industry standard for batch processing tools.

Figure 6:
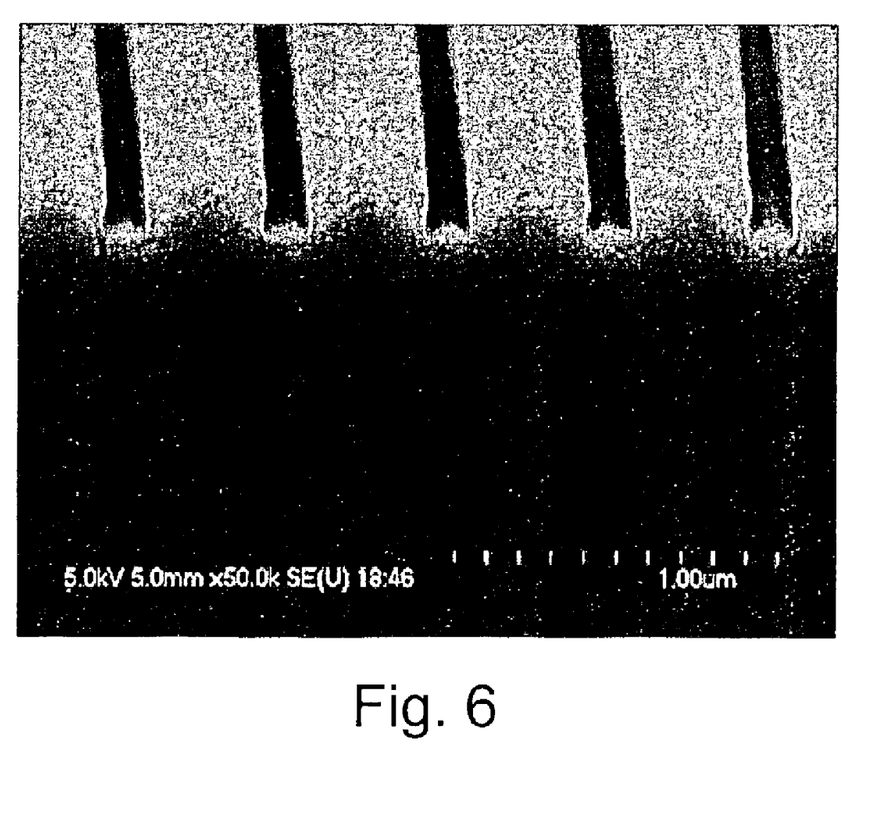
FIG. 6 is an SEM photograph showing the film conformality of a 1000 Å thick, 1-ethynyl-2-fluorobenzene film deposited on 2000 Å (1:1) topography wafers by the inventive PECVD process.

FIG. 6 is an SEM photograph showing the film conformality of a 400 Å thick film of 1-ethynyl-2-fluorobenzene deposited on 7000 Å (1:1) topography wafers by the inventive PECVD process. These SEM photographs demonstrate that PECVD-deposited 1-ethynyl-2-fluorobenzene can provide a greater than 98% conformal film.

The optical constants were measured by VASE analysis. The average real portion of the refractive index (n) and the imaginary index (k) of 1-ethynyl-2-fluorobenzene were n=1.559 and k=0.592 at 193 nm.

The 1-ethynyl-2-fluorobenzene film on a silicon wafer was examined under an optical microscope. No pinholes, striations, dewetting, comets, or particles were observed. The 1-ethynyl-2-fluorobenzene-based films were extremely uniform without any visible defects.

I claim:

1. A method of forming a precursor for use in manufacturing microelectronic, optoelectronic, photonic, or microelectromechanical system devices, said method comprising the steps of:

providing a quantity of monomers and a substrate having a surface onto which a coating layer is to be applied, said monomers having the formula wherein:
each R is individually selected from the group consisting of alkynyl groups and alkenyl groups other than —CH=CH$_2$ and —CH$_2$—CH=CH$_2$;
each X is individually selected from the group consisting of alkyl groups, cyano groups, nitroso groups, and the halogens;
m is 0–10; and
n is 1–12;
forming said monomers into a plasma; and
depositing said plasma monomers onto said substrate surface so as to form the coating layer thereon.

2. The method of claim 1, wherein said ringed structure is selected from the group consisting of moieties of benzene, naphthalene, anthracene, acridine, furan, thiophene, pyrrole, pyridine, pyridazine, pyrimidine, pyrazine, thiazine, oxazine, thiazole, oxazole, pyrazole, oxadiazole, quinazoline, and quinoxaline.

3. The method of claim 2, wherein said monomer has the formula wherein:
each R is individually selected from the group consisting of alkynyl groups;
each X is individually selected from the group consisting of alkyl groups, cyano groups, nitroso groups, and the halogens;
m is 0–5;
n is 1–6; and
the sum of m and n is less than or equal to 6.

4. The method of claim 1, wherein each R is individually selected from the group consisting of $C_2$–$C_{20}$ alkynyl groups and $C_2$–$C_{20}$ alkenyl groups other than —CH=$CH_2$ and —$CH_2$—CH=$CH_2$.

5. The method of claim 1, wherein said monomers are selected from the group consisting of phenylacetylene, 2-ethynyltoluene, 3-ethynyltoluene, 4-ethynyltoluene, 1-ethynyl-2-fluorobenzene, 1-ethynyl-3-fluorobenzene 1-ethynyl-4-fluorobenzene, ethynyl-p-toluene sulfonate, 1-phenyl-2-propyn-1-ol, 4-(trimethylsilylethynyl) benzaldehyde, 1-bromo-2-ethynylbenzene, 1-bromo-4-ethynylbenzene, 1-chloro-2-ethynylbenzene 1-chloro-4-ethynylbenzene, 1-chloro-4-(phenylethynyl)benzene, 1-ethynyl-4-pentylbenzene, 1-ethynyl-4-nitrobenzene, 1-ethynyl-3-methoxybenzene 1-ethynyl-4-methoxybenzene, 1-ethynyl-4-pentylbenzene, 1-(dimethylsilyl)-2-phenylacetylene, 4-bromo-1-ethynyl-2-fluorobenzene, 4-ethynyl-biphenyl, 1-ethynyl-4-methylbenzene, 1-phenyl-1-hexyne, diphenylacetylene, 1-propargyl-1H-benzotriazole, propargyl p-toluenesulfonate, 1-phenyl-2-propyn-1-ol, phenylpropargyl ether, phenylpropargyl aldehyde, phenylpropargyl aldehyde diethyl acetal, 3-ethynylaniline, 4-ethynylaniline, 2-ethynylpyridine, 3-ethynylpyridine, 1-ethynylnaphthalene, 1-ethynyl-1-cyclohexanol, 1-ethynylcyclohexene, 1-ethynylcyclopentanol, 1-ethynylcyclohexylamine, 1-ethynyl-2,4-difluorobenzene, ethynylmagnesium bromide, and ethynylmagnesium chloride, and mixtures thereof.

6. The method of claim 1, further including the step of applying a photoresist layer to said coating layer to yield an integrated circuit precursor structure.

7. The method of claim 1, wherein said monomers have a melting or boiling point of less than about 450° C.

8. The method of claim 7, wherein said monomers have a melting or boiling point of less than about 100° C.

9. The method of claim 1, wherein said substrate is selected from the group consisting of silicon, aluminum, tungsten, tungsten silicide, gallium arsenide, germanium, tantalum, SiGe, and tantalum nitride wafers.

10. The method of claim 1, wherein said plasma forming step comprises subjecting said monomers to an electric current and pressure.

11. The method of claim 10, wherein said electric current is from about 0.1–10 amps.

12. The method of claim 11, wherein said electric current is applied in pulses.

13. The method of claim 10, wherein said pressure is from about 10–200 mTorr.

14. The method of claim 1, wherein said coating layer on said substrate surface after said depositing step has a thickness of from about 100–5000 Å.

15. The method of claim 6, wherein said coating layer is substantially insoluble in solvents utilized in said photoresist layer.

16. The method of claim 6, further including the steps of:
exposing at least a portion of said photoresist layer to activating radiation;
developing said exposed photoresist layer; and
etching said developed photoresist layer.

17. The method of claim 1, wherein said coating layer deposited on said substrate surface is an antireflective layer which absorbs at least about 90% of light at a wavelength of from about 150–500 nm.

18. The method of claim 1, wherein said coating layer deposited on said substrate surface is an antireflective layer which has a k value of at least about 0.1 at light having a wavelength of about 193 nm.

19. The method of claim 1, wherein said coating layer deposited on said substrate surface is an antireflective layer which has an n value of at least about 1.1 at light having a wavelength of about 193 nm.

20. The method of claim 1, wherein said depositing step comprises depositing said monomers on said surface at a rate of at least about 100 Å/min. on an eight-inch round substrate.

21. The method of claim 1, wherein said plasma monomers polymerize during said depositing step.

22. A precursor structure formed during the process of manufacturing microelectronic, optoelectronic, photonic, or microelectromechanical system devices, said structure comprising:
a substrate having a surface; and
a coating layer on said surface, said coating layer being formed by the steps of:
providing a quantity of monomers having the formula wherein:
each R is individually selected from the group consisting of alkynyl groups and alkenyl groups other than —CH=$CH_2$ and —$CH_2$—CH=$CH_2$;
each X is individually selected from the group consisting of alkyl groups, cyano groups, nitroso groups, and the halogens;
m is 0–10; and
n is 1–12;
forming said monomers into a plasma; and
depositing said plasma monomers onto said substrate surface so as to form the coating layer thereon.

23. The structure of claim 22, wherein said ringed structure is selected from the group consisting of moieties of benzene, naphthalene, anthracene, acridine, furan, thiophene, pyrrole, pyridine, pyridazine, pyrimidine, pyrazine, thiazine, oxazine, thiazole, oxazole, pyrazole, oxadiazole, quinazoline, and quinoxaline.

24. The structure of claim 23, wherein said monomer has the formula wherein:
each R is individually selected from the group consisting of alkynyl groups;
each X is individually selected from the group consisting of alkyl groups, cyano groups, nitroso groups, and the halogens;
m is 0–5;
n is 1–6; and
the sum of m and n is less than or equal to 6.

25. The structure of claim 22, wherein each R is individually selected from the group consisting of $C_2$–$C_{20}$ alkynyl groups and $C_2$–$C_{20}$ alkenyl groups other than —CH=$CH_2$ and —$CH_2$—CH=$CH_2$.

26. The structure of claim 22, wherein said monomers are selected from the group consisting of phenylacetylene, 2-ethynyltoluene, 3-ethynyltoluene, 4-ethynyltoluene, 1-ethynyl-2-fluorobenzene, 1-ethynyl-3-fluorobenzene 1-ethynyl-4-fluorobenzene, ethynyl-p-toluene sulfonate, 1-phenyl-2-propyn-1-ol, 4-(trimethylsilylethynyl) benzaldehyde, 1-bromo-2-ethynylbenzene, 1-bromo-4-ethynylbenzene, 1-chloro-2-ethynylbenzene 1-chloro-4-ethynylbenzene, 1-chloro-4-(phenylethynyl)benzene, 1-ethynyl-4-pentylbenzene, 1-ethynyl-4-nitrobenzene, 1-ethynyl-3-methoxybenzene 1-ethynyl-4-methoxybenzene, 1-ethynyl-4-pentylbenzene, 1-(dimethylsilyl)-2-phenylacetylene, 4-bromo-1-ethynyl-2-fluorobenzene, 4-ethynyl-biphenyl, 1-ethynyl-4-methylbenzene, 1-phenyl-1-hexyne, diphenylacetylene, 1-propargyl-1H-benzotriazole, propargyl p-toluenesulfonate, 1-phenyl-2-propyn-1-ol, phenylpropargyl ether, phenylpropargyl aldehyde, phenylpropargyl aldehyde diethyl acetal, 3-ethynylaniline, 4-ethynylaniline, 2-ethynylpyridine, 3-ethynylpyridine, 1-ethynylnaphthalene, 1-ethynyl-1-cyclohexanol, 1-ethynylcyclohexene, 1-ethynylcyclopentanol, 1-ethynylcyclohexylamine, 1-ethynyl-2,4-difluorobenzene, ethynylmagnesium bromide, and ethynylmagnesium chloride, and mixtures thereof.

27. The structure of claim 22, said structure further comprising a photoresist layer on said coating layer.

28. The structure of claim 22, wherein said substrate is selected from the group consisting of silicon, aluminum, tungsten, tungsten silicide, gallium arsenide, germanium, tantalum, SiGe, and tantalum nitride wafers.

29. The structure of claim 22, wherein said coating layer is an antireflective coating layer having a thickness of from about 100–5000 Å.

30. The structure of claim 27, wherein coating layer is an antireflective coating layer which is substantially insoluble in solvents utilized in said photoresist layer.

31. The structure of claim 22, wherein said coating layer is an antireflective layer which absorbs at least about 90% of light at a wavelength of from about 150–500 nm.

32. The structure of claim 22, wherein said coating layer is an antireflective layer which has a k value of at least about 0.1 at light having a wavelength of about 193 nm.

33. The structure of claim 22, wherein said coating layer is an antireflective layer which has an n value of at least about 1.1 at light having a wavelength of about 193 nm.

34. The structure of claim 22, wherein said coating layer has less than about 0.1 defects per $cm^2$ of substrate surface.

* * * * *

UNITED STATES PATENT AND TRADEMARK OFFICE
CERTIFICATE OF CORRECTION

PATENT NO. : 6,852,474 B2 Page 1 of 1
DATED : February 8, 2005
INVENTOR(S) : Sabnis It is certified that error appears in the above-identified patent and that said Letters Patent is hereby corrected as shown below:

<u>Column 1,</u>
Line 15, insert:
    -- FEDERALLY SPONSORED RESEARCH/DEVELOPMENT PROGRAM
    This invention was made with Government support under contract DASG60-01-C-0047 awarded by the United States Army Space and Missile Defense Command. The Government has certain rights in the invention. --.

Signed and Sealed this

Twenty-fifth Day of April, 2006

JON W. DUDAS
*Director of the United States Patent and Trademark Office*